(12) United States Patent
Han

(10) Patent No.: US 6,374,324 B2
(45) Date of Patent: Apr. 16, 2002

(54) FLASH MEMORY ARRAY ACCESS METHOD AND DEVICE

(75) Inventor: Sang-Wook Han, Seoul (KR)

(73) Assignee: Hyundai Electronics Industries Co., Ltd., Kyoungi-Do (KR)

( * ) Notice: Subject to any disclaimer, the term of this patent is extended or adjusted under 35 U.S.C. 154(b) by 0 days.

(21) Appl. No.: 09/271,444

(22) Filed: Mar. 18, 1999

(30) Foreign Application Priority Data

Mar. 18, 1998 (KR) ................................................ 98/9219

(51) Int. Cl.[7] ................................................ G06F 12/00
(52) U.S. Cl. ........................................ 711/103; 711/202
(58) Field of Search .............................. 711/103, 206, 711/169, 202, 208, 209, 102

(56) References Cited

U.S. PATENT DOCUMENTS

| | | | |
|---|---|---|---|
| 5,341,339 A | | 8/1994 | Wells |
| 5,455,934 A | * | 10/1995 | Holland et al. .............. 711/103 |
| 5,568,423 A | | 10/1996 | Jou et al. |
| 5,905,993 A | * | 5/1999 | Shinohara .................... 711/103 |
| 5,943,692 A | * | 8/1999 | Marberg et al. ............ 711/203 |
| 5,987,563 A | * | 11/1999 | Itoh et al. .................... 711/103 |
| 6,131,139 A | * | 10/2000 | Kikuchi et al. ............. 711/103 |
| 6,145,051 A | * | 11/2000 | Estakhri et al. ............. 711/103 |
| 6,148,363 A | * | 11/2000 | Lofgren et al. ............. 711/103 |

* cited by examiner

Primary Examiner—Matthew Kim
Assistant Examiner—Christian P. Chace
(74) Attorney, Agent, or Firm—Birch, Stewart, Kolasch & Birch, LLP

(57) ABSTRACT

The method and device for accessing a flash memory array receives a logical address for the flash memory array, which has been divided into a plurality of blocks. Each block of the flash memory array includes logical address to physical address conversion information for that block. After determining which block the received logical address corresponds, the conversion information for that block is obtained and stored. Memory access operations are then performed using the stored conversion information.

26 Claims, 4 Drawing Sheets

LT₁

| VALIDITY | PHYSICAL/LOGICAL ADDRESS | SECTOR 0 |
|---|---|---|
| | | SECTOR 1 |
| . . . | . . . | |
| | | SECTOR k |

| VALIDITY | PHYSICAL/LOGICAL ADDRESS | SECTOR 0 |
|---|---|---|
| | | SECTOR 1 |
| ⋮ | ⋮ | ⋮ |
| | | SECTOR k |

LT₁

FLASH MEMORY ARRAY ACCESS METHOD AND DEVICE

BACKGROUND OF THE INVENTION

1. Field of the Invention

The present invention is directed to flash memory array access method and device, and in particular to an improved flash memory array access method and device capable of reducing a search time between a logical address from a host and a physical address and improving an access time of the memory.

2. Description of the Background Art

Modern computer systems or digital systems utilize a memory such as a hard disk. However, the hard disk is heavy in weight, has large capacity and consumes a significant amount of electricity. Recently, a flash electrically erasable programmable read only memory EEPROM has been popularly used as a memory device capable of overcoming the aforementioned disadvantages. In addition, the flash EEPROM is reprogrammable, and thus it can be used for updating software connected with system operation.

However, unlike an EEPROM, the flash EEPROM is only reprogrammable after its entire memory array is erased. That is, the flash EEPROM cannot be reprogrammed before being erased.

The flash EEPROM is erased by simultaneously applying a high voltage to source terminals of all transistors (cells) used in the memory. However, the time to perform this erasure is relatively long. Therefore, in order to efficiently perform an erase operation, the memory array is divided into a plurality of blocks, and then memory elements in a corresponding block can be separately erased. The respective blocks include at least two or more sectors that are also managed by the host. Each sector has a user region and an overhead region. The overhead region serves to store the erase frequency information such as an erase cycle frequency.

For example, U.S. Pat. No. 5,341,339 entitled "METHOD FOR WEAR LEVELING IN A FLASH EEPROM MEMORY" to Wells, hereby incorporated by reference in its entirety, is related to a flash EEPROM. In this patent, in order to solve a problem that some memory elements are more frequently erased than the other memory elements and finally become unusable, there is provided a method of equally erasing memory cells by using the erase frequency information. Furthermore, there is described a method of using a lookup table to know the relationship between the physical address and the logical address managed by the host in writing data to a memory array divided into blocks. FIG. 1 is a schematic block diagram illustrating how a memory array constituted by using a conventional flash EEPROM is utilized.

In order to access the memory array 1, the memory array 1 of the conventional flash EEPROM receives a logic address from the host (not illustrated) and generates the physical address corresponding to the logical address. Here, a control unit 2 accessing the memory array 1 and providing a data to the host is used. The control unit 2 includes: an address conversion block 3, which stores a lookup table determining the relationship between the logical address and the physical address, a first database listing the amount of free space in each block of the memory array 1 and the total amount of free space, and a second database listing the amount of invalid data in each block and the total amount of invalid data; and a memory control unit 4 providing the received physical address to the memory array 1 and further providing or receiving a data or table information to or from the memory array 1.

In the case that there is a data that will updated, the previously-stored block containing that data is not erased, but the data is sequentially stored in a vacant space in the memory array. The previously-stored data is managed as invalid data, the block containing the data is erased afterward, and thus it is necessary to determine the relationship between the logical address managed by the host and the physical address. The address conversion block 3 is utilized for such a process. Accordingly, the memory control unit 4 serves to control read and output, write or erase operations of the information connected with the sectors in the blocks where the physical address is designated. The plurality of blocks (not illustrated) composing the memory array 1 respectively include a separate region having the table information as in the lookup table stored by the address conversion block 3.

The data read and output operation from the memory array 1 will now be described.

The read and output operation is started when the control unit 2 illustrated in FIG. 1 receives the logical address from the host. Here, in order to carry out a series of processes, a microprocessor (not illustrated) of the control unit 2 refers to the lookup table of the address conversion block 3 and obtains the physical address pursuant to the relationship between the logical address and the physical address. If there is a corresponding physical address, a valid data included in the physical sector is outputted to the host by using the physical address.

The write operation will now be explained. The host provides the logical address to the control unit 2 illustrated in FIG. 1, as in the read and output operation. At this time, the corresponding physical address is firstly obtained by referring to the lookup table. The lookup table information that corresponds to the provided logical address is invalidated, the first and second databases are updated, and whether a sector which is not presently used in the lookup table exists is determined (i.e., a physical address with no associated logical address). In case there is a vacant usable sector, the data transmitted from the host is written in a physical position of the corresponding sector.

The data can be read afterward by updating the lookup table for the sector. In the case that a usable sector does not exist, the lookup table information that corresponds to the provided logical address is still invalidated and the first and second databases updated. However, the remainder of the write operation is carried out after the erase operation.

The erase operation will now be explained. The block that does not have valid data or has the least amount of valid data is selected using the second database. Selection of the block for erasure can also depend on the number of erasures each block has undergone such as described in U.S. Pat. No. 5,341,339.

In regard to the block that does not include the valid data, a portion of the lookup table connected with the block and the table information in the memory array 1 are amended, the erase operation is performed on the block that will be erased, and then the remainder of the write operation is carried out. The erase operation is performed by applying, for example, a voltage of 12 V to a source of a floating-gate field-effect transistor composing the memory cell.

In the case the block that will be erased includes valid data, the valid data is transmitted to a portion of the memory array 1 set aside for dealing with part of the erase operation.

Then, the corresponding lookup table and table information are amended and the erase operation is carried out. Subsequently, the remainder of the write operation takes place.

As described so far, the lookup table is very important in using the memory in the conventional art. However, the conventional method has a disadvantage in that it takes relatively long time to carry out the read and output operation or to search the lookup table for obtaining the physical address of the sector that the host will access.

Also, when the write operation is performed, the lookup table for invalidating a previously-written sector must be searched, which requires a considerable amount of time.

SUMMARY OF THE INVENTION

The method and device for accessing a flash memory array accesses a flash memory array divided into a plurality of blocks. Each block includes logical address to physical address conversion information for that block. After determining to which block a received logical address corresponds, the method and device obtain the conversion information for that block, store the obtained conversion information, and then perform a memory access operation based on the received logical address and the stored conversion information. In this manner, only conversion information for a block is searched to perform a memory access operation, instead of conversion information for the entire flash memory array as in the conventional art.

Accordingly, the present invention provides an improved high-speed flash EEPROM access method and device capable of processing data at high-speed.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A flash memory array access method and device in accordance with a preferred embodiment of the present invention will now be described with reference to the accompanying drawings.

First, the constitution of a memory array composed of flash memory cells will now be explained with reference to FIG. 3. The memory array having the flash memory cells is divided into a plurality of blocks pursuant to an erase characteristic of a flash EEPROM device. The blocks demanding an erase operation can be erased, and thus all the blocks are not erased.

Figure 3:
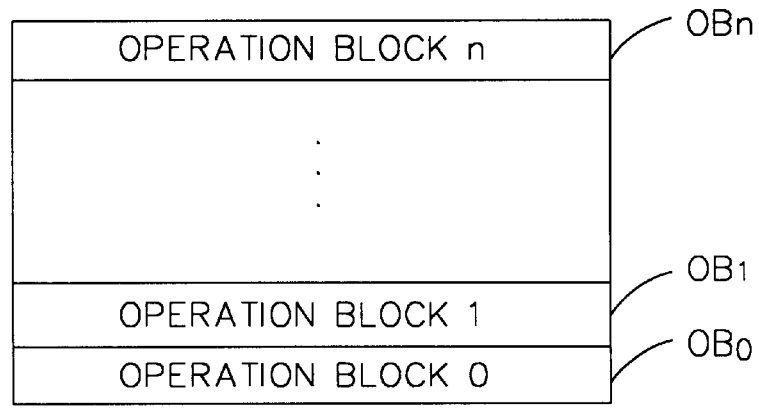
FIG. 3 is a schematic diagram illustrating a memory array divided into a plurality of operation blocks in accordance with the present invention.

As illustrated in FIG. 3, the flash memory array 11 includes a plurality of operation blocks $OB_0$–$OB_n$. Each block has an identical constitution, and thus the constitution of a first operation block $OB_1$ will now be described.

Figure 4:
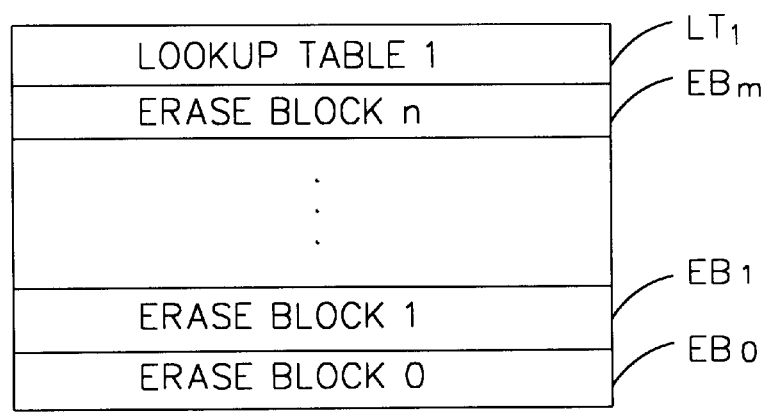
FIG. 4 is a constitutional diagram of a single operation block illustrated in FIG. 3.

The constitution of the operation block in accordance with the present invention is illustrated in FIG. 4. In the present invention, there are provided a plurality of lookup tables determining a relationship between a logical address and a physical address. That is, as shown in FIG. 4, the respective operation blocks each have a lookup table giving the relationship between a logical address and a physical address for each data in the operation block and indicating whether the data is valid or invalid. In this case, the first operation block $OB_1$ has the lookup table $LT_1$. As each operation block $OB_0$–$OB_n$ has a lookup table, there are provided 'n' lookup tables. Based on the aforementioned constitution, each lookup table is searched in operation block units in the present invention. Consequently, the processing speed is remarkably improved, as compared with searching a physical address by using a single lookup table for a flash memory having a large capacity.

Figures 5, 6:
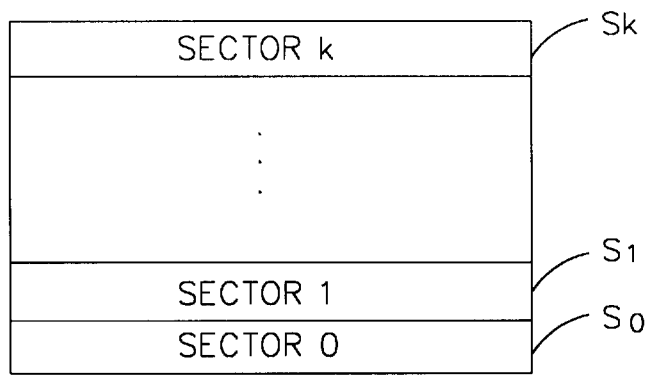
FIG. 5 is a constitutional diagram of a single block illustrated in FIG. 4.
FIG. 6 is a constitutional diagram of a single lookup table illustrated in FIG. 5.

New data is sequentially written in a vacant block. Updated data is also written in a vacant block and the corresponding previously-stored data is managed as invalid data. Furthermore, the operation blocks are divided into a plurality of erase blocks $EB_0$–$EB_n$, as illustrated in FIG. 4. Each erase block $EB_0$–$EB_n$ is independently erasable, and has a plurality of sectors $S_0$–$S_k$, as shown in FIG. 5. The respective sector addresses are managed by the respective lookup table.

The lookup table will now be described with reference to FIG. 6. Each operation block has an identical constitution, accordingly only a first lookup table $LT_1$ assigned to the first operation block $OB_1$ will be described with reference to FIG. 6. For example, the lookup table maintains the logical address that corresponds to the physical address for a sector and indicates the validity of data stored in the sector. A corresponding sector illustrated in FIG. 5 is accessed by the searched physical address.

Figure 1:
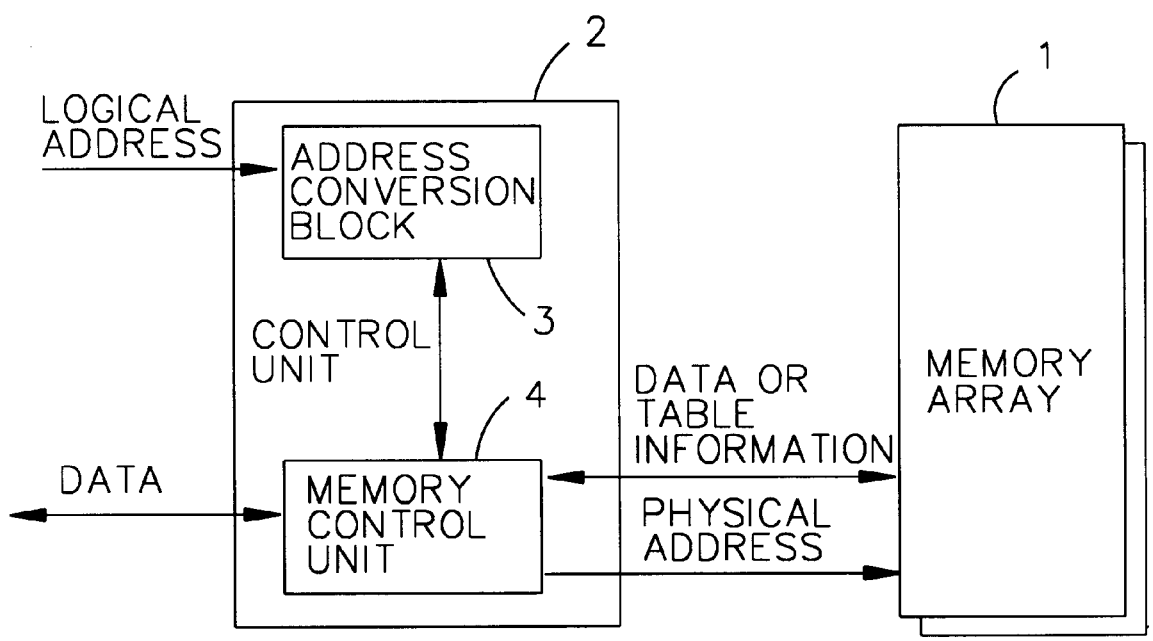
FIG. 1 is a constitutional block diagram of a conventional flash memory array access device.
Figure 2:
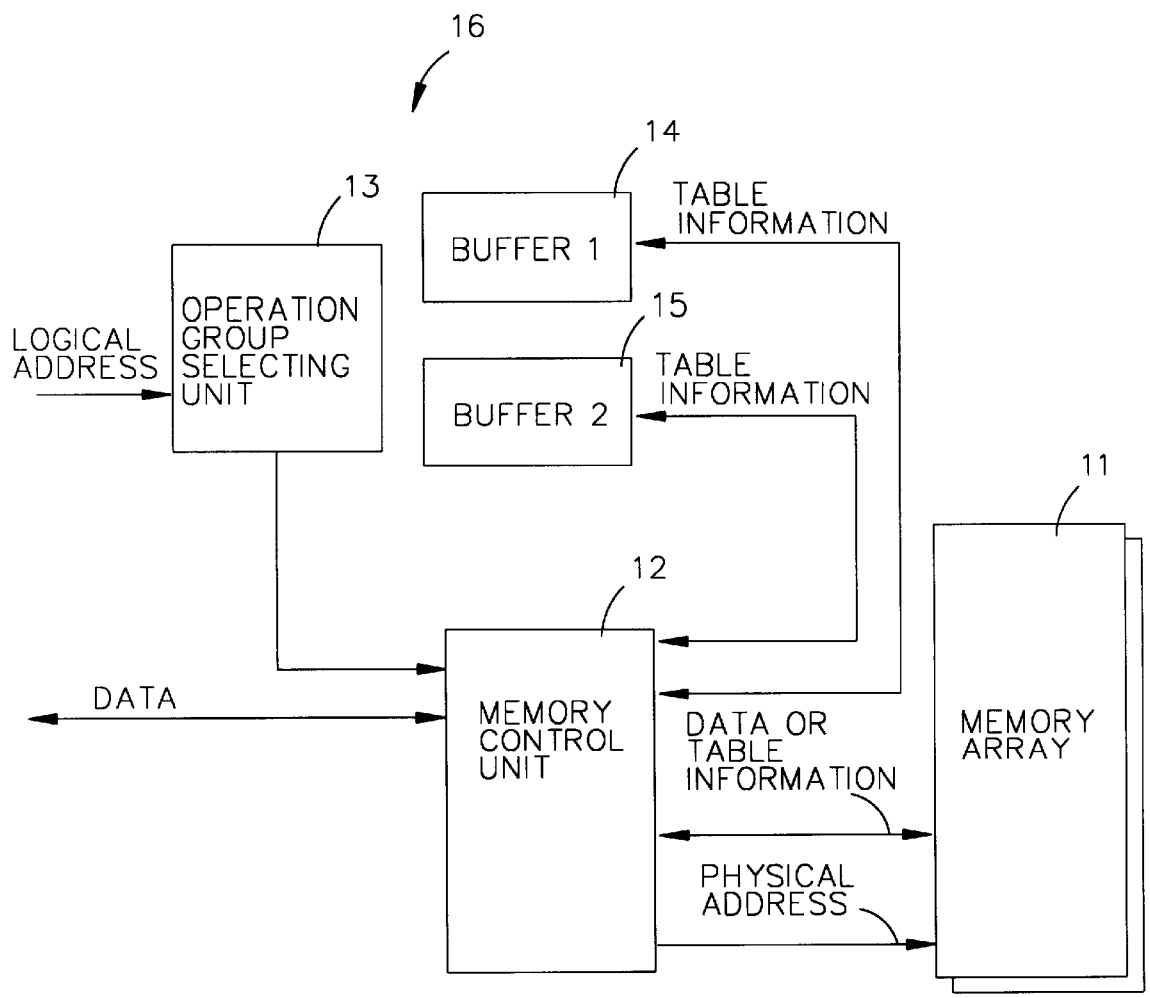
FIG. 2 is a constitutional block diagram of a flash memory array access device in accordance with the present invention.

As illustrated in FIG. 2, the control unit 16 according to the present invention serves to generate the physical address pursuant to the logical address from the host, read and output a data in the memory array 11, carry out a write operation on the memory array 11, or carry out an erase operation of a memory element.

The control unit 16 includes: an operation group select unit 13 receiving the logical address from the host and selecting the corresponding operation block; first and second buffers 14 and 15 temporarily storing a look-up table; and a memory control unit 12 carrying out a control function such as managing the lookup table for the flash memory, generating the physical address, and performing the read, output, write, and erase operations.

When a data in the memory array 11 is read and outputted to the host (not illustrated) or a data is written in the memory array 11, a logical and easily-usable address is used. Such a logical address is inputted to the operation group select unit 13 of the control unit 16.

The operation group select unit 13 serves to select one of the plurality of operation blocks in the memory array 11 based on the logical address. Here, a constant divider or a comparator can be used in accordance with a preferred embodiment of the present invention to determine the operation block as described in detail below. A different embodiment can be carried out by those skilled in this field, based on the following description; however, such embodiments are all included in the present invention.

For instance, it is assumed that the flash memory array 11 is represented by a decimal system, and, for example, has addresses from 0 to 1000 divided into 10 operation blocks of 100 addresses each. Here, when the logical address, '250' is given from the host, a number of the operation block including the logical address becomes '2'. This shows the constant divider can be employed. In the case that the operation group select unit 13 is embodied by the constant divider, a value obtained by dividing the host logical address by 100 can be used as the number of the operation group block, and the value is inputted to the memory control unit 12. On the other hand, when the operation group select unit 13 is embodied by the comparator, the number of the operation group can be designated by comparing in which range of the compared reference values, for instance, 0–99, 100–299, . . . 900–999, an inputted host logical address exists. Accordingly, in a preferred embodiment of the present invention, some correlation exists between the logical address and the physical structure of the memory array 11.

The memory control unit 12 is provided with the number of the operation group block and selects the second operation block $OB_2$ corresponding to the value '2' in the above-described example among the operation blocks illustrated in FIG. 3.

It is preferred that the memory control unit 12 is provided with a microprocessor (not shown), and a read-only memory ROM (not shown) storing predetermined software for controlling every operation in accordance with the present invention. The memory control unit 12 controls memory operations pursuant to an external order such as the write operation or the read and output operation.

First, the read and output operation of the present invention will now be explained.

The logical address is transmitted to the memory control unit 12 from the host with a read and output order, and then a predetermined process according to the present invention is performed. At this time, the logical address is also transmitted to the operation group select unit 13. As described above, the number of the operation block having the transmitted logical address is outputted from the operation group select unit 13. The memory control unit 12 then accesses the operation block indicated by the operation group select unit 13 and stores the look-up table thereof in the first buffer 14. For instance, if the operation group select unit 13 indicates the first operation block $OB_1$, the memory control unit 12 accesses the first operation block $OB_1$ and temporarily stores the first look-up table $LT_1$ in the first buffer 14. Then, the memory control unit 12 confirms whether the first operation block $OB_1$ includes the logical address matching the logical address transmitted from the host using the first lookup table $LT_1$.

In case the identical logical address exists in the first lookup table $LT_1$, a corresponding sector is found by using the physical address corresponding to the logical address given in the look-up table $LT_1$. Accordingly, the memory control unit 12 can provide data to the host by accessing the sector having this physical address.

In case the logical address from the host is not in the first lookup table $LT_1$, the memory control unit 12 outputs a 'no sector' signal to the host.

While the details of the read and output operation have been described with respect to the first operation block $OB_1$, it will be understood by those skilled in the art that this operation applies to each operation block.

The search range of the lookup table is similar to the size of the selected operation block in the above-described operation, and therefore it is not necessary to utilize the information of all blocks, unlike in the conventional method. Accordingly, the search time can be remarkably reduced.

The data write operation of the present invention will now be described.

The logical address is transmitted to the memory control unit 12 from the host with a write order, and then a predetermined process according to the present invention is performed. Here, the logical address is also transmitted to the operation group select unit 13. As described above, the number of the operation block including the logical address is outputted from the operation group select unit 13. The memory control unit 12 then accesses the operation block indicated by the operation group select unit 13 and stores the look-up table thereof in the first buffer 14. For instance, if the operation group select unit 13 indicates the first operation block $OB_1$, the memory control unit 12 accesses the first operation block $OB_1$ and temporarily stores the first look-up table $LT_1$ in the first buffer 14. Then, the memory control unit 12 confirms whether the first operation block $OB_1$ includes a logical address matching the logical address transmitted from the host using the first lookup table $LT_1$.

In case the identical logical address exists in the first lookup table $LT_1$, the corresponding information in the first lookup table $LT_1$ is no longer usable, and thus that information must be invalidated. Then, a vacant or unused sector (i.e., a sector not being used in the first lookup table $LT_1$) is searched for using the first look-up table $LT_1$. If the identical logical address from the host is not found in the first lookup table $LT_1$, a vacant sector (i.e., a sector with no associated logical address) is also searched for using the first look-up table $LT_1$.

If an unused sector is located from the first lookup table $LT_1$, the data transmitted from the host is written in the unused sector by referring to the physical address of the sector given in the first look-up table $LT_1$. At this time, a relationship between the physical address of the sector and the logical address is formed, and thus the presently-used lookup table $LT_1$ in the first buffer 14 is updated. The memory control unit 12 re-stores the updated contents of the first lookup table $LT_1$ in the first operation block to use afterward.

In the case that an unused sector does not exist, a data is newly written in the vacant sector after carrying out the erase operation as described in detail below.

While the details of the write operation have been described with respect to the first operation block $OB_1$, it will be understood by those skilled in the art that this operation applies to each operation block.

The erase operation of the present invention will now be described.

As discussed briefly above, the erase operation is conducted when a vacant sector cannot be located in which to write new data. Continuing with the example above, if the first lookup table $LT_1$ does not indicate a vacant sector exists for storing newly received data, then the erase operation is performed. In performing the erase operation, the memory control unit 12 first searches the first lookup table $LT_1$ for an erase block that does not include any valid data. If such an erase block is located, the memory control unit 12 causes the memory array 11 to erase this erase block, and store the new data in one or more sectors of the erased erase block. Furthermore, the memory control unit 12 updates the first lookup table $LT_1$ based on the foregoing changes to the erase block, and restores the first lookup table $LT_1$ in the first operation block $OB_1$.

If the memory control unit 12 does not locate an erase block including no valid data, the memory control unit 12 then searches for the erase block having the least amount of valid data. Any valid data in the located erase block is then transferred from the erase block to a set of sectors within the memory array 11 that serve as temporary storage for such operations. The memory control unit 12 then causes the memory array 11 to erase the chosen erase block, restore the valid data transferred to the temporary sectors, and store the new data. The memory control 12 then updates the first lookup table $LT_1$ based on the foregoing changes, and restores the first lookup table $LT_1$ in the first operation block $OB_1$.

While the details of the erase operation having been described with respect to the first operation block $OB_1$, it will be understood by those skilled in the art that this operation applies to each operation block.

Other conventional preferred processing methods connected with the above-described erase operation can be further included. However, it must be noted that such a combination is also included in the present invention. For instance, selection of the erase block for erasure can also depend on the number of erasures as described U.S. Pat. Nos. 5,341,339 and 5,568,423, both of which are hereby incorporated by reference in their entirety. Therefore, in order to process data by further including the added conventional methods, the operation blocks can further include separate regions capable of having the information required for such a process. For example, a sector can have an user region and an overhead region, and the erase operation can be carried out in the entire memory array 11 by using the overhead information.

The method and device of the present invention can also process data in a pipe line method for efficient high-speed processing. This pipeline operation will now described.

The pipe line method processes data in parallel. As illustrated in FIG. 2, a second buffer 15 is employed in addition to the first buffer 14. When only the first buffer 14 is used, the operation connected with one lookup table is performed, and the next operation can only be carried out once the first buffer 14 is no longer in use. However, the second buffer 15 allows temporary storage of the next lookup table for the next operation when a lookup table of a current operation is stored in the first buffer 14. Accordingly, the lookup table associated with successive operations are alternately stored in the first and second buffers 14 and 15. This allows substantially parallel performance of two operations according to the method of the present invention.

The buffer used in the present invention is optional. In general, the memory control unit 12 has a random access memory RAM which can be used instead. In the present invention, the buffer serves to improve the processing speed.

In accordance with the present invention, the addresses in a restricted range are searched by using one of a plurality of lookup tables. This results in a more efficient high-speed process.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed:

1. A method of accessing a flash memory array, comprising:
    a) receiving a logical address at a controller for the flash memory array;
    b) determining, at the controller, a block of the flash memory array to access based on the received logical address, the flash memory array being divided into a plurality of blocks, each block for storing data and having logical address to physical address conversion information;
    c) obtaining the conversion information from the determined block;
    d) storing the obtained conversion information for the determined block at the controller; and
    e) performing a memory access operation on the flash memory array using the controller based on the received logical address and the stored conversion information.

2. The method of claim 1, wherein the step b) comprises:
    b1) dividing the received logical address by a predetermined number; and
    b2) determining the determined block using output from the dividing step.

3. The method of claim 2, wherein each block in the flash memory array is identified by an integer number such that an integer value of the output from the step b1) identifies the determined block.

4. The method of claim 1, wherein the step b) comprises:
    b1) determining in which of a plurality of predetermined ranges the received logical address falls, each range corresponding to one of the blocks in the flash memory array; and
    b2) determining the determined block as the block corresponding to the determined predetermined range.

5. The method of claim 1, wherein each physical address in the conversion information for each block identifies at least one sector in the block.

6. The method of claim 1, wherein the conversion information is a table indicating a relationship between each physical address of a sector in the block and a logical address corresponding thereto.

7. The method of claim 6, wherein the table further indicates whether each sector stores valid or invalid data.

8. The method of claim 1, wherein
    the step a) receives a read command associated with the received logical address; and
    the step e) includes the following sub-steps when the step a) receives the read command,
        e1) determining if the received logical address matches a logical address in the stored conversion information,
        e2) identifying a physical address associated with the received logical address from the stored conversion information if the step e1) determines a match exists,
        e3) accessing data stored in the identified physical address, and
        e4) outputting the accessed data from the controller.

9. The method of claim 8, wherein the step e) further includes the following sub-step when the step a) receives the read command,
    e5) outputting an error signal if the step b) does not determine a match exists.

10. The method of claim 1, wherein
    the step a) receives a write command and data associated with the received logical address;

the conversion information includes an indicator, corresponding to each physical address in the conversion information, indicating whether the corresponding physical address is one of valid and invalid; and the step e) includes the following sub-steps when the step a) receives the write command,
- e1) determining if the received logical address matches a logical address in the stored conversion information,
- e2) setting the indicator corresponding to a physical address associated with the received logical address to invalid in the stored conversion information if the step e1) determines a match exists,
- e3) identifying unused space in the determined block of the flash memory array from the stored conversion information,
- e4) storing the received data in the identified unused space if the step e3) identifies unused space,
- e5) updating the stored conversion information to indicate the relationship between a physical address of the identified unused space and the received logical address if the step e3) identifies unused space, and
- e6) rewriting the conversion information for the determined block in the flash memory array using the stored conversion information.

11. The method of claim 10, wherein
each block of the flash memory array is divided into a plurality of erase blocks, and each erase block is independently erasable and includes at least one sector;
the step e3) identifies an unused sector in the determined block; and the step e) further includes the sub-steps of,
- e7) determining an erase block in the determined block storing the least amount of valid data using the stored conversion information when the step e3) fails to identify an unused sector;
- e8) storing valid data in the determined erase block in a temporary storage portion of the flash memory array;
- e9) erasing the determined erase block;
- e10) storing the received data in the determined erase block;
- e11) updating the stored conversion information based on the storing of the received data in the erased determined erase block; and wherein
the step e6) rewrites the conversion information for the determined block in the flash memory array using the stored conversion information after one of the steps e5) and e11).

12. The method of claim 1, wherein the steps a)–e) are performed in a pipelined fashion.

13. A device for accessing a flash memory array, comprising:
a selecting unit receiving a logical address for the flash memory array, and determining a block of the flash memory array to access based on the received logical address, the flash memory array being divided into a plurality of blocks, each block for storing data and having logical address to physical address conversion information;
at least one storage device for storing conversion information;
a control unit receiving the received logical address, obtaining the conversion information from the determined block, storing the obtained conversion information for the determined block in the storage device, and performing a memory access operation on the flash memory array based on the received logical address and the stored conversion information.

14. The device of claim 13, wherein the selecting unit divides the received logical address by a predetermined number, and determines the determined block using a result of the division.

15. The device of claim 14, wherein each block in the flash memory array is identified by an integer number such that the selecting unit identifies the determined block as an integer value of the result from the division.

16. The device of claim 13, wherein the selecting determines in which of a plurality of predetermined ranges the received logical address falls, each range corresponding to one of the blocks in the flash memory array, and determines the determined block as the block corresponding to the determined predetermined range.

17. The device of claim 13, wherein each physical address in the conversion information for each block identifies at least one sector in the block.

18. The device of claim 13, wherein the conversion information is a table indicating a relationship between each physical address of a sector in the block and a logical address corresponding thereto.

19. The device of claim 18, wherein the table further indicates whether each sector stores valid or invalid data.

20. The device of claim 13, wherein
the control unit receives a read command associated with the received logical address, and in response thereto determines if the received logical address matches a logical address in the stored conversion information, identifies a physical address associated with the received logical address from the stored conversion information if a match exists, accesses data stored in the identified physical address, and outputs the accessed data.

21. The device of claim 20, wherein, in response to the read command, the control unit outputs an error signal if a match does not exist between the received logical address and a logical address in the stored conversion table.

22. The device of claim 13, wherein
the conversion information includes an indicator, corresponding to each physical address in the conversion information, indicating whether the corresponding physical address is one of valid and invalid; and
the control unit receives a write command and data associated with the received logical address, and in response to the write command, determines if the received logical address matches a logical address in the stored conversion information, sets the indicator corresponding to a physical address associated with the received logical address to invalid in the stored conversion information if a match exists, identifies unused space in the determined block of the flash memory array from the stored conversion information, stores the received data in the identified unused space if unused space is identified, updates the stored conversion information to indicate the relationship between a physical address of the identified unused space and the received logical address if unused space is identified, and rewrites the conversion information for the determined block in the flash memory array using the stored conversion information.

23. The method of claim 22, wherein
each block of the flash memory array is divided into a plurality of erase blocks, and each erase block is independently erasable and includes at least one sector;
the control unit identifies an unused sector in the determined block when identifying the unused space, and determines an erase block in the determined block storing the least amount of valid data using the stored conversion information when an unused sector is not identified, stores valid data in the determined erase block in a temporary storage portion of the flash memory array, erases the determined erase block, stores the received data in the determined erase block, updates the stored conversion information based on the storing of the received data in the erased determined erase block, and rewrites the conversion information for the determined block in the flash memory array using the stored conversion information after updating the stored conversion information.

24. The device of claim 13, further comprising:

first and second storage devices; and wherein the control unit operates in a pipelined manner by alternately storing the conversion information for subsequently determined blocks in the first and second storage devices.

25. The device of claim 13, wherein the storage device is a buffer.

26. The device of claim 13, wherein the control unit includes the storage device.

* * * * *